United States Patent [19]
Tanaka

[11] Patent Number: 5,345,191
[45] Date of Patent: Sep. 6, 1994

[54] BROAD-BAND AMPLIFIER

[75] Inventor: Naojiro Tanaka, Kanagawa, Japan

[73] Assignee: Leader Electronics Corp., Kanagawa, Japan

[21] Appl. No.: 99,569

[22] Filed: Jul. 30, 1993

[30] Foreign Application Priority Data

Jul. 31, 1992 [JP] Japan .................... 4-205244

[51] Int. Cl.$^5$ .................... H03F 1/30; H03F 3/16
[52] U.S. Cl. .................... 330/277; 330/85; 330/290; 330/300
[58] Field of Search .................... 330/9, 85, 87, 97, 277, 330/290, 300, 151

[56] References Cited

U.S. PATENT DOCUMENTS 4,495,471  1/1985  Barrett .................... 330/290 X

FOREIGN PATENT DOCUMENTS 59-144914  9/1984  Japan .
59-189318  12/1984  Japan .
61-1926    1/1986  Japan .
61-15622   5/1986  Japan .
62-82703   4/1987  Japan .
63-12580   4/1988  Japan .
63-15764   4/1988  Japan .

Primary Examiner—James B. Mullins
Attorney, Agent, or Firm—Fish & Richardson

[57] ABSTRACT

Voltage control means output to a variable resistance part 2 a control voltage proportionate to an error between an input detection signal of an input terminal $T_i$ of a source follower field-effect transistor 1 and an output detection signal of an output-side transistor 5. Although said variable resistance part 2 changes its resistance value in accordance with a control voltage, a drain current flowing from the field-effect transistor to said variable resistance part is maintained constant by a constant-current source 3. Thus, an output voltage of the output side transistor changes in accordance with said error, thereby controlling the input detection voltage and the output detection voltage to be constantly the same.

4 Claims, 4 Drawing Sheets

BROAD-BAND AMPLIFIER

BACKGROUND OF THE INVENTION

The present invention relates to a broad-band amplifier used for a broad-band input amplifier stage such as an oscilloscope, etc. and particularly to a broad-band amplifier which is capable of compensating a drift effect caused by scattering characteristics of elements, a temperature change, etc.

In a broad-band amplifier according to a prior art used for analog electronic measuring instruments, a broad-band frequency signal ranging from DC to high frequency needs to be amplified at a low drift. Especially, when such a conventional broad-band amplifier is employed for a vertical input circuit such as an oscilloscope, etc., it has to have both a high input impedance to alleviate a load effect on a signal source to be measured and a low output impedance to broaden a band of a post amplifier. Furthermore, there has been a demand for a stable broad-band amplifier with a small drift caused by scattering characteristics of elements or a temperature change.

As is disclosed in Japanese Patent Publication No. 61-1926 Official Gazette and Japanese Utility Model No. 61-15622 Official Gazette, it has been known that input signals are separated into high-frequency signal components and low-frequency signal components to be amplified and the thus amplified high-frequency and low-frequency signals are added. Thus, according to said system, signals are separated into high-frequency signals and low-frequency signals and the thus separated signals are respectively amplified by two different amplifiers to accomplish a stable broad-band amplification. However, a field-effect transistor employed in this system requires the application of a self-bias. Since a self-bias requires a high resistance value, thermal noise tends to be generated in the resistance, which causes a distorted output waveshape.

In order to solve the aforementioned problem, a broad-band amplifier which utilizes a source-follower field effect transistor and which is not greatly affected by a drift caused by scattering characteristics of elements and an ambient temperature change has been developed as is disclosed in Japanese Patent Publication No.63-15764 Official Gazette. Such a broad-band amplifier will briefly be explained by way of FIG. 5. In the figure, a gate and a drain of a field-effect transistor 31 are respectively connected to an input terminal 32 and a positive voltage source, the source being connected to a negative voltage source via a constant current source consisting of a bipolar transistor 33 and a resistor :34. A source of the field-effect transistor 31 is further connected to a base of a transistor 35. A potential divider 36 disposed on the input terminal 32 and another potential divider 37 disposed on the output side have almost the same dividing ratio, divided input signals and output signals being provided to an operational amplifier 38. Error signals of the operational amplifier are sent to a base of the transistor 33 via a low-pass filter 39 consisting of a resistor and a condenser.

In FIG. 5, an input signal to be applied on the input terminal 32 is amplified by a broad-band amplifier having the field-effect transistor 31 and a transistor 35 (amplification factor: about 1). A signal passage including the aforementioned input potential divider 36, output potential divider 37 and operational amplifier 38 stabilizes a circuit of a broad-band amplifier at low frequency and also improves accuracy thereof. The operational amplifier 38 compares a part of a signal from the input potential divider 36 with a part of an output signal from the output potential divider 37 and applies an error signal between them on the base of the transistor 33. When a gate source voltage Vgs of the field-effect transistor 31 or a base emitter voltage $V_{BE}$ changes in accordance with difference in operating condition and as a result, an output voltage and an input voltage become different from each other, a part of an output signal of the operational amplifier 38 being fed back to the operational amplifier 38, the difference between an output voltage and an input voltage being automatically corrected by the high-gain operational amplifier 38 and the current source transistor 33. More specifically, the output voltage is corrected in such a manner that it automatically becomes equal to the input voltage regardless of the change in Vgs and $V_{BE}$.

The broad-band amplifier described in FIG. 5 stabilizes a circuit within a low frequency band by changing a drain current Id to change the gate source voltage Vgs of the source-follower field-effect transistor 31. Therefore, it does not require an auto-bias resistor and thus, thermal noise is not generated. However, when an emitter current flowing through the transistor 33, that is, a drain current Id of the field-effect transistor 31 changes, a mutual conductance $g_m$ which constitutes transfer characteristics of the field-effect transistor 31 also changes. Thus, the change in the mutual conductance $g_m$ affects amplification characteristics of the source-follower field-effect transistor 31 within a high-frequency band.

SUMMARY OF THE INVENTION

The object of the present invention is to provide a broad-band amplifier which Functions to correct drift, etc. generated in an internal element and prevents deterioration of amplification characteristics within a high-frequency band.

The broad-band amplifier of the present invention comprises a source follower field-effect transistor which is connected to an input terminal, a constant current source which is connected to a source side of said field-effect transistor to provide a constant source current, a voltage variable resistance element which varies resistance in accordance with an applied control voltage, an output terminal and an input terminal thereof being connected to said constant current source and a source of said field-effect transistor respectively, an output side transistor to which a voltage signal of an output terminal of said voltage variable resistance element is supplied, a voltage control means which applies an error between an output detection voltage of said output side transistor and an input detection voltage of said input terminal as a control voltage on said voltage variable resistance element, characterized in that said input detection voltage and output detection voltage are controlled to be almost the same.

The amplifier according to the invention comprises a variable gain amplifier which amplifies a voltage signal of an output terminal of said voltage variable resistance element and sends the thus amplified signal to said output side transistor and an output voltage adjusting means which adjusts the level of an output detection voltage of said output side transistor along with switching of a gain of said variable gain amplifier.

The broad-band amplifier according to the invention is characterized in that the input detection voltage is generated by dividing resistances connected to the input terminal of the field-effect transistor while the output detection voltage is generated by dividing resistances connected to the output terminal of the output side transistor.

The voltage control means outputs to a voltage variable resistance element a control voltage which is proportion to an error between an input detection signal of an input terminal of a source-follower field-effect transistor and an output detection signal of an output side transistor. Although said voltage variable resistance element varies its resistance value in accordance with the control voltage, the source current flowing from the field-effect transistor to the element remains constant. As a result, a base voltage to be applied on the output side transistor varies in accordance with a change in a voltage variable resistance element so that an output voltage of said transistor varies in accordance with said error, and an input detection voltage and an output detection voltage are adjusted to be the same.

Furthermore, according to the invention, a voltage signal of an output terminal of a voltage variable resistance element is amplified before being applied on the output side transistor, and the level of an output signal on output side transistor can be adjusted by controlling a detection level of an output detection signal which is fed back to a voltage control means.

According to the invention wherein a drain current running in a source-follower field-effect transistor used as a high input impedance circuit is maintained constant, It is possible to maintain a mutual conductance of said field-effect transistor almost constant and therefore, amplification characteristics of a broad-band amplifier do not deteriorate. Furthermore, a drift of an output voltage caused by a change in ambient temperature, etc. is automatically compensated and therefore, it is possible to achieve stable amplification which is not affected by scattering characteristics of an element or a change in action point due to temperature change. As the broad-band amplifier of the present invention has especially stable amplification characteristics, it is suitable as an amplifier for an initial stage of an oscilloscope which is used to measure signals within a frequency band ranging from DC to about 250 MHz.

According to the present invention, it is also possible to attain an amplifier with a small drift when a variable gain amplifier is connected. When it is used for an input amplification stage of an oscilloscope, a vertical axis sensitivity can be easily changed.

DETAILED DESCRIPTION OF THE PREFERRED EMBODIMENT

Figure 1:
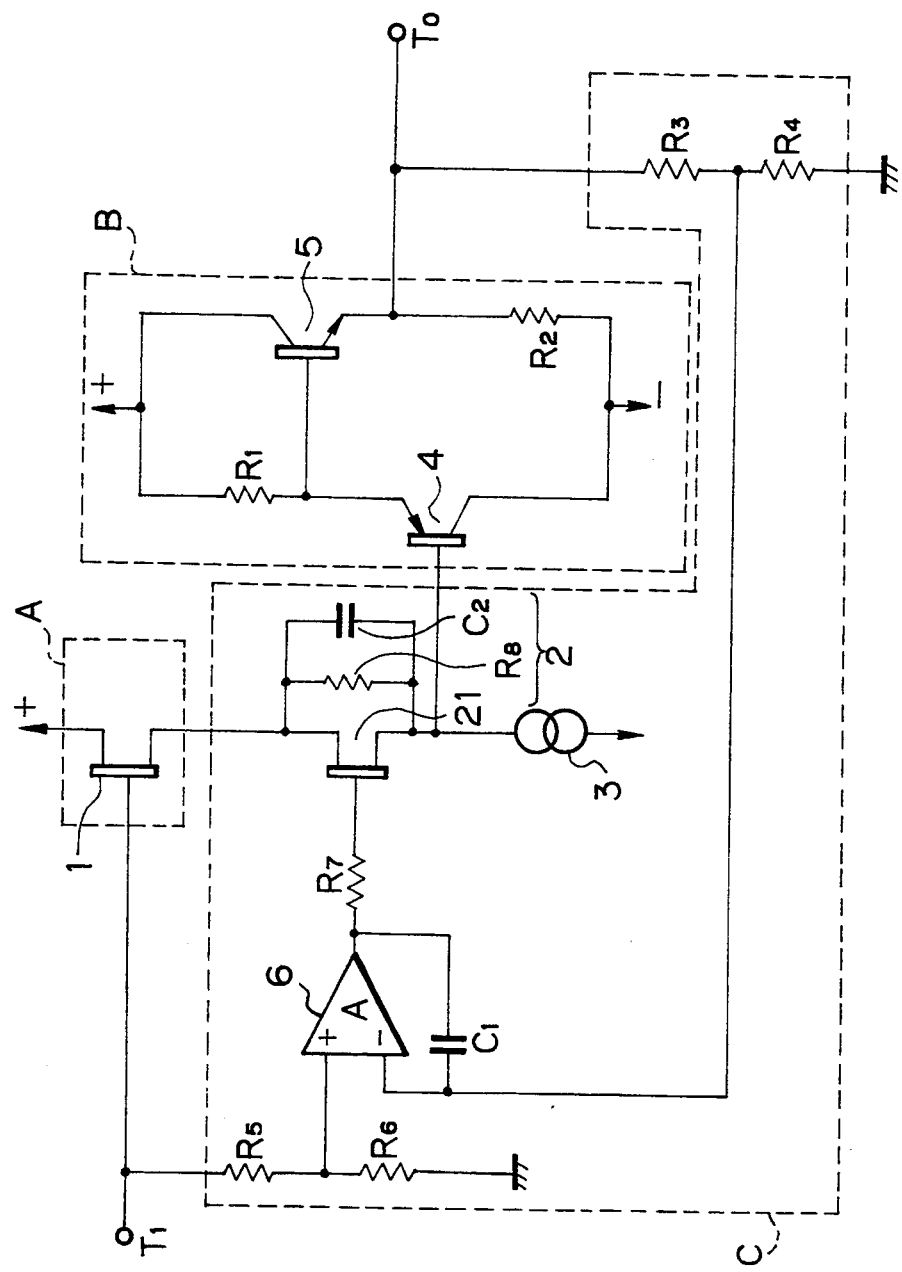
FIG. 1 is a circuit diagram illustrating an embodiment of the broad-band amplifier according to the present invention.

FIG. 1 shows an embodiment of a broad-band amplifier of the present invention. As is indicated in broken line in FIG. 1, a broad-band amplifier consists of a high input impedance part A, a low output impedance part B and a compensation circuit part C. The high input impedance part A comprises a source-follower field-effect transistor 1, an input signal being input into a gate terminal of said field-effect transistor 1 (input terminal Ti). A source terminal of the field-effect transistor 1 is connected to a variable resistance part 2 and a constant current source 3 in series. The constant current source 3 may have a known circuit structure wherein a constant current regularly flows. A contact point of an output terminal of the variable resistance part 2 and an input terminal of the constant current source 3 is connected to a base of a pnp transistor 4. A negative voltage is applied on a collector of the pnp transistor 4, an emitter thereof being connected to a base of a npn transistor 5 and further to a positive power source via a resistance $R_1$. The pnp transistor 4 adjusts the level of a bias voltage $V_{be2}$ to be applied on a base of the npn transistor 5. A collector of the npn transistor 5 is connected to a positive power source, an emitter terminal thereof being connected to a negative power source via a resistance $R_2$ and an output voltage being taken out thereof as an output terminal To. Said low output impedance part B mainly consists of the pnp transistor 4 and the npn transistor 5.

Dividing resistance elements $R_3$ and $R_4$ are connected in series between the output terminal To and ground. An output detection voltage is taken out of a central node between $R_3$ and $R_4$, and the thus taken-out voltage is provided to an input terminal on the negative side of the operational differential amplifier 6. On the other hand, dividing resistance elements $R_5$ and $R_6$ are connected between said input terminal Ti and ground. An input detection voltage is taken out of the central contact point between $R_5$ and $R_6$, and the thus taken-out voltage is provided to an input terminal on the positive side of the operational differential amplifier 6. The differential operational amplifier 6 amplifies the difference between the two detection voltages and applies a control voltage on a variable resistance part 2 via a resistance $R_7$. A capacitor $C_1$ is connected to the differential operational amplifier 6 and mainly amplifies low-frequency components. Said compensation circuit part C chiefly comprises a variable resistance part 2, a constant current source 3, dividing resistance elements $R_3$ and $R_4$, dividing resistance elements $R_5$ and $R_6$ and a differential operational amplifier 6.

Figure 2:
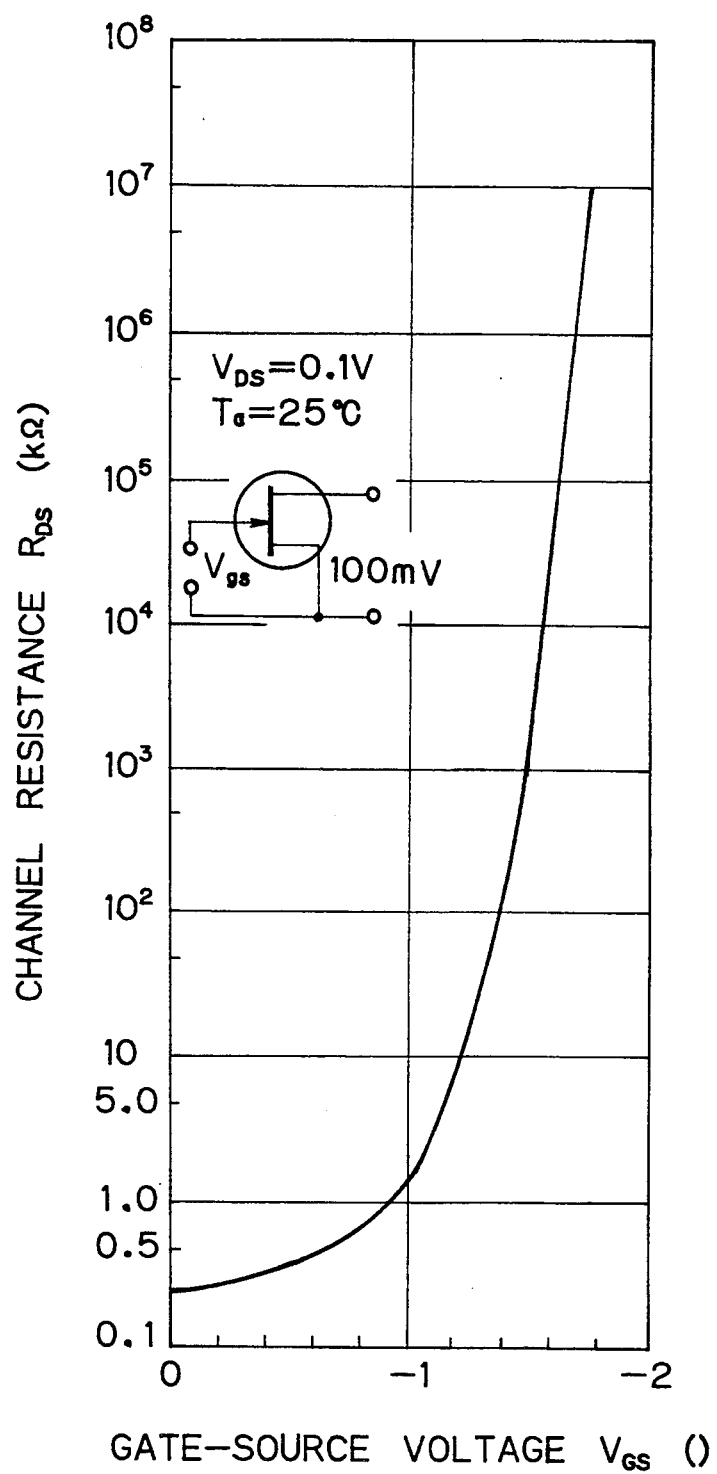
FIG. 2 is a diagram showing a relationship between a gate-source voltage of a field-effect transistor and a drain-source resistance of a field-effect transistor.

The variable resistance part 2 consists of a field-effect transistor 21, and a resistance element $R_8$ and a capacitor $C_2$ connected in parallel between a source and a drain of the field-effect transistor 21. The resistance element $R_8$ is a shunt resistance which shunts a channel resistance $R_{DS}$ of the field-effect transistor 21 in order to send the drain current of the field-effect transistor 1 to the constant current source 3. The capacitor $C_2$ is disposed for a high-frequency characteristics compensation in order to pass a high-frequency signal. A control voltage from the differential operational amplifier 6 is applied on a gate of the field-effect transistor 21. FIG. 2 illustrates an exemplary relationship between the voltage $V_{GS}$ between a gate and a source of the field-effect transistor 21 and the resistance $R_{DS}$ between a drain and a source of the field-effect transistor 21, wherein it is clear that as the voltage $V_{GS}$ increases, the resistance $R_{DS}$ also increases. Thus, when a control voltage is also applied to a gate of the field-effect transistor 21, the voltage $V_{GS}$ between the gate and the source varies in accordance with a change in the control voltage and as a result, the resistance $R_{DS}$ also varies. Accordingly, the field-effect transistor 21 acts as a voltage control variable resistance element which varies a resistance between a source and a drain by a control voltage.

Next, the operation of the broad-band amplifier described in FIG. 1 will be explained. For the sake of explanation, the variable resistance part 2 is replaced by a variable resistance element R, the resistance value of which is varied by a control voltage. Assuming that an input voltage Vi to be applied on an input terminal Ti and a voltage between a gate and a source of the field-effect transistor 1 is Vgs, the voltage Vgs is determined by a drain current and a pinch-off voltage depending on temperature. Since a drain current Id of the field-effect transistor 1, that is, a current running into the constant current source 3 remains constant, a voltage drop of R·Id occurs between a source terminal of the field-effect transistor 1 and an input terminal of the constant current source 3. Therefore, a voltage of (Vi−Vgs−R·Id) is applied on a base of the pnp transistor 4. Assuming that a voltage between a base and an emitter of the pnp transistor 4 is $V_{be1}$, a voltage between a base and an emitter of the npn transistor 5 being $V_{be2}$, an output voltage of the output terminal To being $V_o$, the output voltage $V_o$ can be represented as the following equation (1).

$$V_o = V_i - V_{gs} - R \cdot Id + V_{be1} - V_{be2} \quad (1)$$

Although the object of the present invention is to attain the relationship $V_o = V_i$, the drift factors $V_{gs}$, $V_{be1}$ and $V_{be2}$ exist. Thus, the following equation (2) is obtained from the above equation (1).

$$-V_{gs} - R \cdot Id + V_{be1} - V_{be2} = 0 \quad (2)$$

If the equation (2) holds good, the drift to be generated in the internal element of the broad-band amplifier can be eliminated. The equation (2) can be transformed into the following equation (3).

$$R = (-V_{gs} + V_{be1} - V_{be2})/Id \quad (3)$$

Since the variable resistance element R comprises a combined resistance of a channel resistance $R_{DS}$ and the resistance $R_8$ of the field-effect transistor 21, it can be represented by the following equation (4).

$$R = (R_{DS} \cdot R_8)/(R_{DS} + R_8) \quad (4)$$

The following equation (5) is obtained from the above equations (3) and (4).

$$(R_{DS} \cdot R_8)/(R_{DS} + R_8) = (-V_{gs} + V_{be1} - V_{be2})/ID \quad (5)$$

When $V_{gs}$, $V_{be1}$ and $V_{be2}$ are drifted due to a temperature change, etc., an appropriate value of the resistance $R_8$ is chosen and a voltage between a gate and a source of the field-effect transistor 21 is controlled as is indicated in FIG. 2, Thereby, the channel resistance $R_{DS}$ is changed to satisfy the equation (5), so that the output voltage $V_o$ and the input voltage $V_i$ can be constantly the same.

When a drift occurs in the output voltage due to change in ambient temperature, etc., the output detection voltage changes in response to the drift and the error between the output detection voltage and the input detection voltage is amplified, the thus amplified error being applied on the gate of the field-effect transistor 21 as a control voltage. As is explained above, the resistance $R_{DS}$ between the source and the gate changes in accordance with the change in control voltage. Since the drain current Id of the field-effect transistor 1 is kept constant regardless of the change in the resistance $R_{DS}$, the base voltage of the pnp transistor 4 changes in accordance with the change in the resistance $R_{DS}$. As a result, the base emitter voltage $V_{be1}$ and $V_{be2}$ both change to eliminate the drift of the output voltage $V_o$. As the compensation circuit C operates in such a manner that the input detection voltage and the output detection voltage become the same, a drift does not occur in the output voltage $V_o$. Furthermore, as the drain current Id of the field-effect transistor 1 is kept constant, the mutual conductance of the field-effect transistor i is also kept constant and therefore, there is no such inconvenience as a distorted output waveshape caused by change in operating point.

Figure 3:
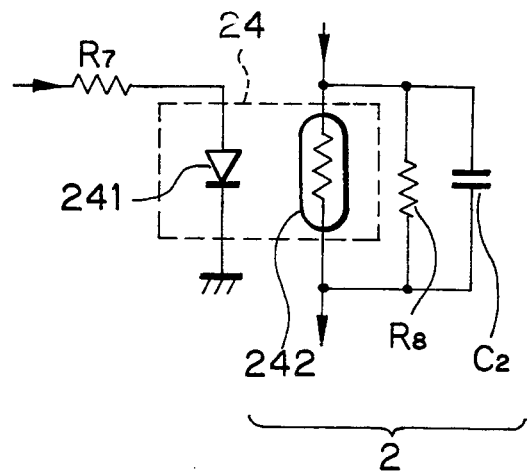
FIG. 3 shows another embodiment of a variable resistance element which can be disposed in the voltage control part in FIG. 1.
Figure 5:
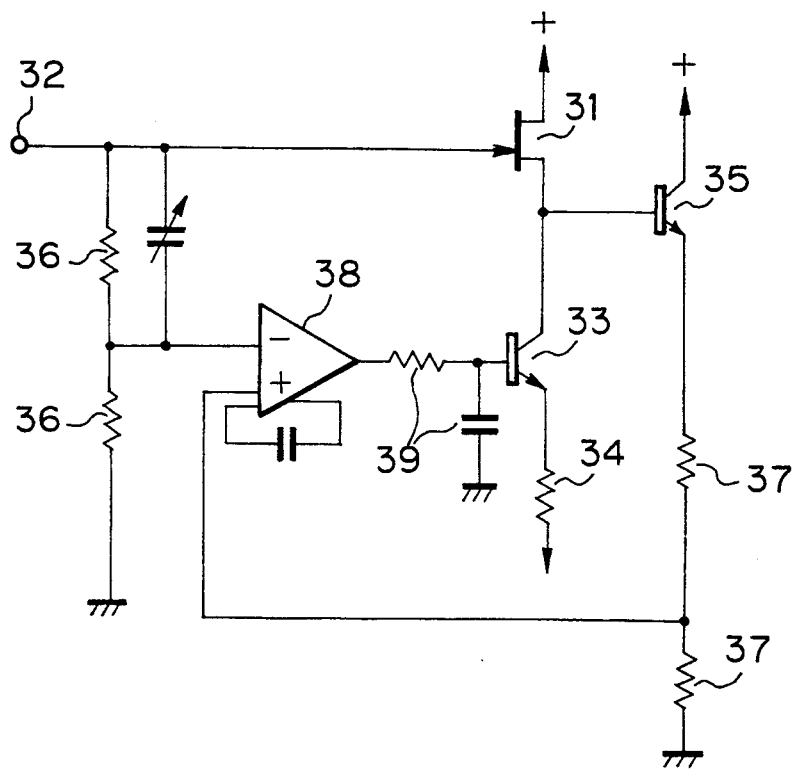
FIG. 5 is a circuit diagram showing a broad-band amplifier according to a prior art.

Although the field-effect transistor 21 is employed in the embodiment of the broad-band amplifier in FIG. 1 as a variable resistance element which can be disposed at the variable resistance part 2, a CdS opt-isolator 24 may be employed instead as is indicated in FIG. 3. In the embodiment indicated in FIG. 3, a control voltage output by the differential amplifier 6 is applied on a photodiode 241 of the CdS opt-isolator 24. A light proportional to the control voltage is output From the photodiode 241 and irradiates a CdS 242 to further change the resistance value in accordance with intensity of light. As a result, the CdS opt-isolator 24 functions as a variable resistance element and generates a voltage drop R·Id (R refers to an equivalent resistance of the variable resistance part 2) due to flowing-in current Id. Since the structure and operation concerning the parts other than the variable resistance 2 are the same as those described in FIG. 2, explanation of them will be omitted.

Figure 4:
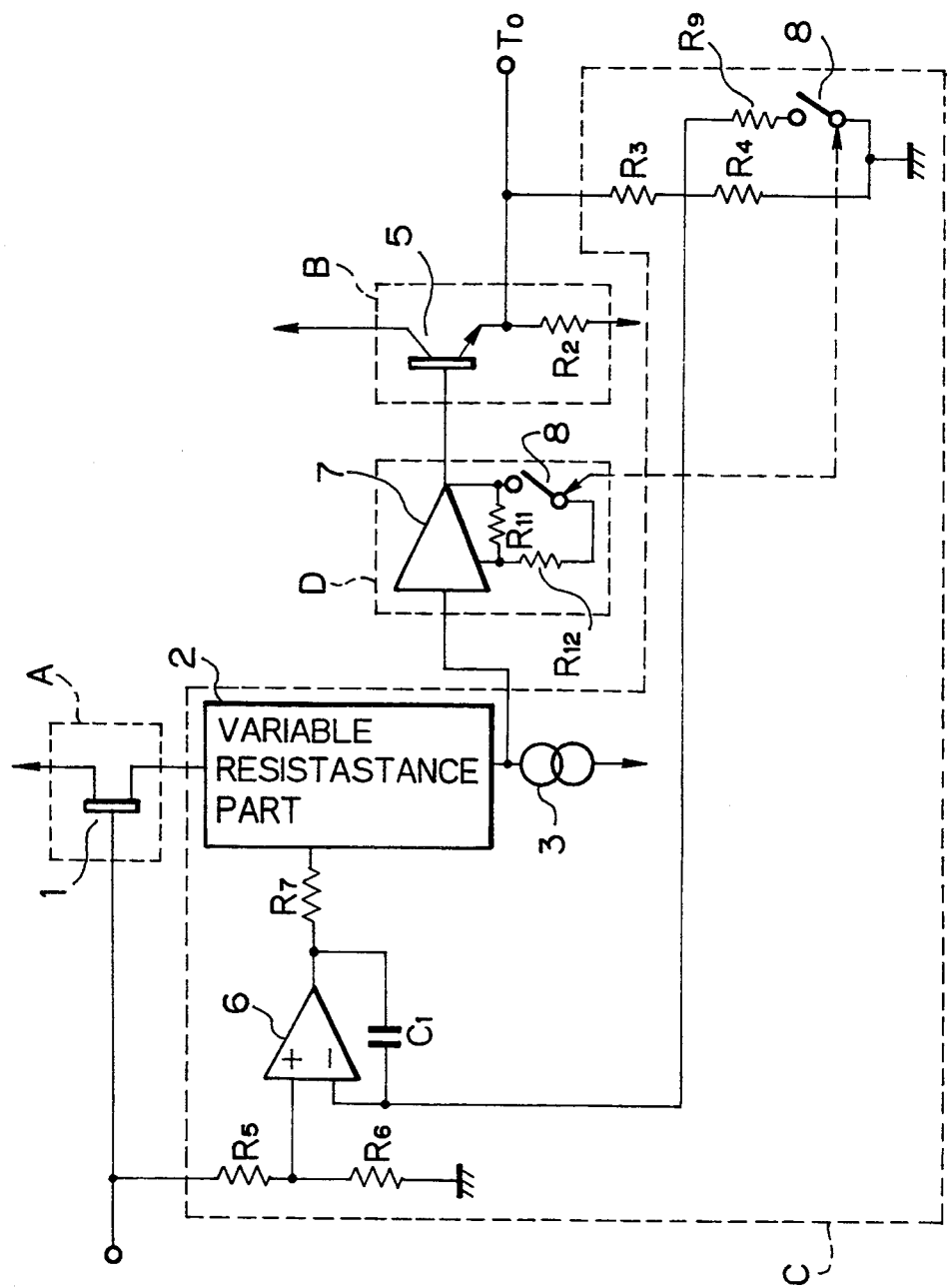
FIG. 4 is a circuit diagram showing another embodiment of a broad-band amplifier according to the present invention.

FIG. 4 illustrates an embodiment of the present invention, wherein the corresponding parts in FIGS. 1 and 4 are represented by the same symbols. The difference in structure between the amplifier of FIG. 1 and that of FIG. 4 lies in the fact that a variable amplifying part D is connected between the central node of the variable resistance part 2 and the constant current source 3 and a low output impedance part B. The variable amplifying part D comprises an operational amplifier 7 whose gain is variable. The lower output impedance part B consists only of the npn transistor 5, an output of the operational amplifier 7 being directly applied on the base of said transistor 5. The operational amplifier 7 is connected to a resistance $R_{11}$ which determines a gain. When the linked switches 8 are turned on, the resistance element $R_{12}$ is connected to the resistance element $R_{11}$ in parallel. When the linked switches are on, a dividing resistance element $R_9$ is connected to a dividing resistance element $R_4$ in parallel. In this embodiment, the gain of the operational amplifier 7 is 2 when the linked switches 8 are open, whereas the gain is set to be 10 when the switches 8 are turned on. The relationship between an input voltage $V_i$ and an output voltage $V_o$ of the broad-band amplifier in FIG. 4 can be represented by the Following equation (6), assuming that the gain of the operational amplifier 7 is G.

$$V_o = (V_i - V_{gs} - R \cdot Id) \cdot G - V_{be2} \qquad (6)$$

Although the object of the invention is to attain the relationship $V_o = G \cdot V_i$, the drift factors $V_{gs}$, $V_{be2}$ and G exist. Thus, the following equation (7) is obtained from the above equation (6).

$$(-V_{gs} - R \cdot Id) \cdot G - V_{be2} = 0 \qquad (7)$$

If the equation (7) holds good, the drift caused in the internal element of the broad-band amplifier can be eliminated. The equation (7) can be transformed into the following equation (8).

$$R = (-G \cdot V_{gs} - V_{be2})/(G \cdot Id) \qquad (8)$$

The following equation (9) can be obtained from the above equations (4) and (8).

$$R_{DS} \cdot R_8 = (-G \cdot V_{gs} - V_{be2})/(G \cdot Id) \qquad (9)$$

Therefore, as in the case of FIG. 1, the voltage between the gate and the source of the field-effect transistor 21 is controlled, thereby changing the channel resistance $R_{DS}$ to satisfy the equation (9), so that the input voltage $V_i$ and the drain current Id remain the same. In FIG. 4, the drain current Id of the field-effect transistor 1 remains constant, and therefore, the mutual conductance thereof also remains constant, thereby preventing a distorted output voltage. The output detection voltage generated when the linked switches are on can be determined by replacing $R_4$ with $R_4 \cdot R_9/(R_4 + R_9)$.

A broad-band amplifier in accordance with the present invention is characterized by the features specified in the characterizing portion of claim 1.

What is claimed is:

1. A broad-band amplifier comprising:
   a source follower field-effect transistor which is connected to an input terminal,
   a constant current source which is connected to a source side of the field-effect transistor to provide a constant source current,
   a voltage variable resistance element which varies a value of resistance in accordance with a control voltage to be applied, an output terminal and an input terminal thereof being connected to the constant current source and a source of the field-effect transistor respectively,
   an output side transistor to which a voltage signal of the output terminal of the voltage variable resistance element is supplied, and
   a voltage control means which applies an error between an output detection voltage of the output side transistor and an input detection voltage of the input terminal as a control voltage on the voltage variable resistance element, whereby the input detection voltage and output detection voltage are controlled to be almost the same.

2. A broad-band amplifier according to claim 1 further comprising:
   a variable gain amplifier which amplifies a voltage signal of the output terminal of the voltage variable resistance element and sends the amplified signal to the output side transistor, and
   an output voltage adjusting means which adjusts a level of the output detection voltage of the output side transistor along with switching of a gain of the variable gain amplifier.

3. A broad-band amplifier according to claim 1, wherein the input detection voltage is generated by dividing resistances connected to the input terminal of the field-effect transistor while the output detection voltage is generated by dividing resistances connected to an output terminal of the output side transistor.

4. A broad-band amplifier according to claim 2, wherein the input detection voltage is generated by dividing resistances connected to the input terminal of the field-effect transistor while the output detection voltage is generated by dividing resistances connected to an output terminal of the output side transistor.

* * * * *